United States Patent [19]

Kirstein

[11] Patent Number: 4,653,003

[45] Date of Patent: Mar. 24, 1987

[54] ELECTRONIC CONTROL SYSTEM FOR A MOTIVE UNIT

[75] Inventor: Gerhard Kirstein, Augsburg, Fed. Rep. of Germany

[73] Assignee: Zahnraderfabrik Renk Aktiengesellschaft, Fed. Rep. of Germany

[21] Appl. No.: 600,039

[22] Filed: Apr. 13, 1984

[30] Foreign Application Priority Data

Apr. 15, 1983 [DE] Fed. Rep. of Germany ....... 3313688

[51] Int. Cl.$^4$ ............................................. G06F 11/00
[52] U.S. Cl. ............................... 364/424; 364/431.11; 371/16; 371/20
[58] Field of Search ................. 364/424, 424.1, 431.04, 364/431.11, 551; 371/16, 20; 340/52 F; 73/116, 117.3, 118

[56] References Cited

U.S. PATENT DOCUMENTS

| | | |
|---|---|---|
| Re. 31,582 | 5/1984 | Hosaka et al. .................. 364/431.01 |
| 4,282,573 | 8/1981 | Imai et al. ....................... 364/431.11 |
| 4,335,428 | 6/1982 | Miki et al. ......................... 364/424.1 |
| 4,337,513 | 6/1982 | Furuhashi ....................... 364/431.11 |
| 4,340,935 | 7/1982 | Anlauf et al. ........................... 371/20 |
| 4,355,360 | 10/1982 | Asano et al. .................... 364/431.11 |
| 4,401,971 | 8/1983 | Saito et al. .......................... 340/52 F |
| 4,495,457 | 1/1985 | Stahl .................................. 364/424.1 |
| 4,503,479 | 3/1985 | Otsuka et al. .................. 364/431.11 |

FOREIGN PATENT DOCUMENTS 2072883 2/1981 United Kingdom .

Primary Examiner—Gary Chin
Attorney, Agent, or Firm—Larson and Taylor

[57] ABSTRACT

Components of a motive unit to be checked are connected to a control system that includes a microcomputer through branch lines. One branch line serves to provide trigger signals and test the components in the normal operating state when the parts are rotating (i.e. in the dynamic state). The other branch serves to monitor the same components for malfunctions in the stopped condition when the parts are not moving (i.e. in the static state). The other branch contains a switching network, a current/voltage source controlled by the microcomputer, and an analog-to-digital converter. There is further provided a priority control circuit over which program interrupt requests or requests for changing to an emergency program are transmitted. In the event a malfunction causes an interrupt request to be generated, the interrupt request from the priority control circuit is transmitted immediately or with a delay depending upon the priority assigned to the particular event malfunction.

9 Claims, 3 Drawing Figures

ELECTRONIC CONTROL SYSTEM FOR A MOTIVE UNIT

BACKGROUND OF THE INVENTION

The present invention relates to an electronic control system for a motive unit, and more particularly to an electronic control system for vehicles that utilizes a microcomputer which cooperates with the electrical components and sensing components of the vehicle.

The present invention is an electronic control system of the type disclosed in West German Offenlegungsschrift No. 2,933,527 for controlling a "motive unit." As used herein, a "motive unit" is defined as including at least one gear shift transmission and, in addition, may also include a drive unit.

SUMMARY OF THE INVENTION

A major object of the present invention is to prevent accidents and damage arising from a technical breakdown of a motive unit or engine for vehicles. An object of the present invention is to monitor critical variables and to take steps such that when a malfunction occurs, the engine will not be damaged. In addition, with the present invention unknown trouble spots can be located and the frequency of certain malfunctions on known trouble spots recorded statistically.

According to the present invention, the objects are achieved by providing a protective mechanism that is connected to a microcomputer. When the operating voltage is switched on, the microcomputer monitors the rotating parts of the engine and upon detecting the nonrotation of one of the components of the engine responds by submitting a query through electrical means that initiates either an emergency subroutine or initiates the normal operating subroutine for controlling the engine, depending upon the result of the received data from, for example, some of the electrical components. The present invention constantly receives data from the components while in the operating state and depending upon the received data, can interrupt the engine operating subroutine when a malfunction occurs and initiate an emergency subroutine.

The present invention offers the advantage of preventing accidents and damages to an engine resulting from a technical breakdown. A check is performed on the electrical components in both the operating, rotating state and also in the stopped or rest state. Faults can be located and a statistical record of them can be made. Sensors can be rotational or speed sensors or elements that provide speed-dependent signals, as well as pressure gauges and temperature gauges. Other components can include switches and relays.

BRIEF DESCRIPTION OF THE DRAWINGS

Several specific embodiments of the present invention will now be described with reference to the accompanying drawings, in which.

DETAILED DISCRIPTION OF THE PREFERRED EMBODIMENTS

Initially, the fundamental method and operating mode of a control system according to the present invention will be set forth in order to provide a better understanding of the operation of the present invention.

An automatic check of the electrical components of a motive unit or engine is performed with the components not only in the dynamic or operational state, but also in the static or rest state. Thus, for example with respect to a vehicle, the rest or static state can be with the gear shift transmission in neutral and the engine switched off. In the operating state, the engine is turned on and the gear shift transmission can either be in neutral or in a certain gear. In both cases, however, the electrical components of the present invention are operative only when the operating voltage is turned on. This operating voltage in the case of a vehicle can also be designated the on-board voltage or vehicle system voltage.

Furthermore, the present invention can perform a self-test of the electronic control system and its protective gear for detecting internal faults.

With respect to a vehicle, the static or rest state or condition is defined when the gear speed and motor speed are zero. The rest condition is detected by a program interrupt request which can determine which of the components being monitored triggered the interrupt.

In the present invention, a programmed microcomputer is utilized in which there is a main program, a normal operating program which can be a part of the main program, subprograms including a subprogram subroutine, and one or more emergency programs. In addition, the microcomputer software contains a test routine for the rest condition. When the test routine is initiated, a self-test or check of the electronic system of the control system and particularly of its protective gear is first performed. Only after the test routine is performed are the individual electrical components of the motive unit checked. If there is a malfunction, such as in a pulse generator, a magnet, a pressure switch, or a temperature gauge, the test routine is terminated and a jump is made to an emergency program which is then initiated. In this condition, the emergency program controls the engine or motive unit instead of the normal operating program.

With the foregoing as a background, the present invention will now be described with respect to a particular embodiment thereof in which like numerals represent like elements throughout the several figures.

Figure 1:
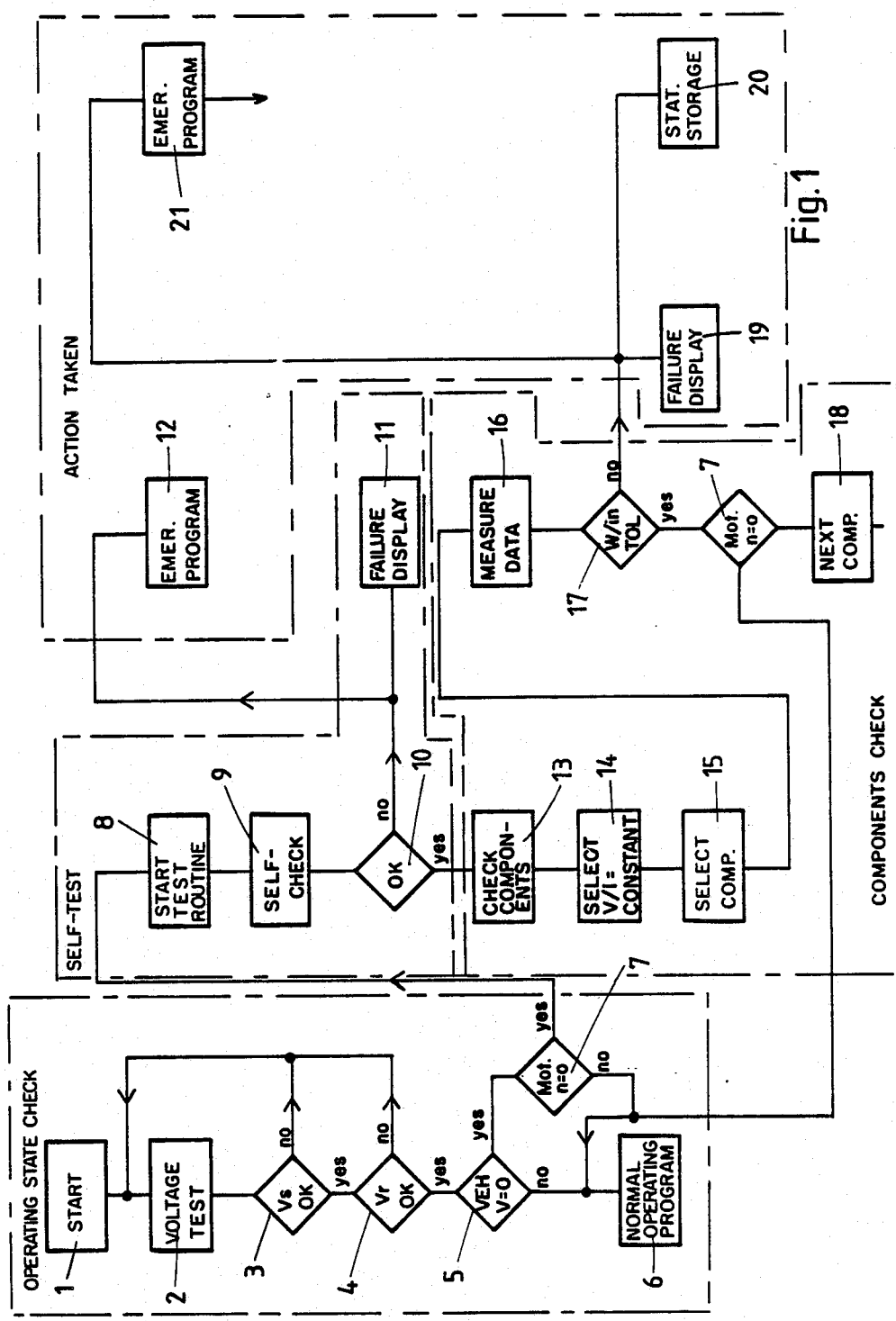
FIG. 1 is a computer flow diagram depicting a method according to the present invention.

With initial reference to FIG. 1, a flow chart or diagram of the software of one embodiment of the present invention is depicted. In processing box 1, the control system is turned on and initialized by operating a switch to connect the vehicle supply voltage to the control system. In this case, the control system is automatically adjusted to an initial state, also called the "auto reset" state. The program then proceeds to a processing box 2 where voltage tests of the control system operating voltage Vs and of the regulated voltage Vr are initiated. From processing box 2, the program proceeds to a decision diamond 3 where the test is made to determine whether the operating voltage Vs falls within predetermined values, e.g., $18 V. < Vs < 32 V$. If the operating voltage Vs lies outside the predetermined values, the program returns through a feedback loop to the top of processing box 2. If the operating voltage Vs lies within the predetermined values, the program proceeds to a decision diamond 4 where the regulated voltage Vr is checked to see if it falls within predetermined limits, for example, 4.8 V<Vr<5.2 V. If the regulated voltage falls outside the predetermine values, the program branches back through a feedback loop to processing box 2. If the regulated voltage lies within the predetermined values, the program branches to a decision diamond 5 where the vehicle speed is determined to see if it is zero, that is v=0 km/h. A rotational speed sensor is utilized for this determination and at a vehicle speed of zero, a variable I3 is set equal to the number 1.

If the vehicle speed is not zero, the program branches to a processing box 6 where the program commences to operate under the normal operating program for controlling the vehicle. For example, the transmission can be kept at its present gear or can be automatically shifted to a higher or lower gear, depending upon the determined vehicle speed. On the otherhand, if the vehicle speed is determined to be zero, then the program branches from decision diamond 5 to a decision diamond 7 where a determination is made whether the vehicle engine is off. A rotational-speed sensor can be utilized to provide the engine speed nMOT. When nMOT=0, a variable I4 is set equal to 1. If the program determines in decision diamond 7 that the engine speed is not zero, i.e. I4 not equal to I corresponding to nMOT not equal to 0, the program branches once again to processing box 6 where a switch is made to the operating program. On the otherhand, if it is determined in decision diamond 7 that the engine speed is zero, a subprogram "test routine" is initiated in a processing box 8.

The test routine performed by the program in processing box 8 first includes a self-check of the electronic control system, particularly of its protective elements. This means that the control system first tests itself to determine if it is in working order. This decision is made in a program decision diamond 10. If the control system is not OK, the program branches to a processing box 11 where a diagnostic routine is performed. The system also proceeds to a processing box 12 where as emergency program is initiated by the main program. The emergency program can, for example, switch off the automatic system of the engine transmission, change the transmission over to the manual-shift operation, shift out of a defective gear of the transmission, shift to a different gear, or block any gear shifting.

On the other hand, if a determination is made by the program in decision diamond 10 that the electronic system is in working order, then the system branches to a processing box 13 where the individual components of the motive unit are checked by the test routine. For example, a gear shift transducer magnet of the transmission of the motive unit can be tested. To this end, the system proceeds to a processing box 14 where a current/voltage test source is switched to the "current" state. This means that this source works as a current source and delivers a constant current irrespective of voltage variations, i.e. i=constant. If, on the other hand, the programmable power source is switched to "voltage," then the power source delivers a constant voltage regardless of the consumption of current i, i.e. voltage V=a constant. As should be appreciated, the subprogram "test routine" causes the current/voltage power source to switch to either constant current or to constant voltage depending upon the type of component being checked.

The program then proceeds to a processing box 15 where a switch in a test lead connected to the electronic component to be checked is turned on. For example in the present case, it can be an input switch magnet. The program then proceeds to a processing box 16 where certain electrical data from components can be measured during the test routine. For example, the voltage can be measured through a gear shift transducer magnet. It is also possible to test the gear shift transducer magnets of all of the gears one at a time.

The program after conducting the test and receiving the test data then proceeds to a decision diamond 17 where a decision is made to determine whether the measured value of the tested component lies within predetermined tolerances. For example, the measured or determined value can be indicated by the variable R1. If the tested component lies within the prescribed tolerances, the program branches to test another component, for example, the voltage of the gear shift transducer magnet of the second gear, which is accomplished in a processing box 18. The value of the test results is stored under the variable R2. Other components which may be tested can include check points to determine gear temperatures, gear defects, bearing temperatures, oil pressures and speeds. As shown in FIG. 1, it is also possible that prior to testing each particular component, a new check is made to determine if the engine is off, i.e. whether nMOT=0 signifying that the engine speed is zero. This is done in a decision diamond 7' located between decision diamond 17 and processing box 18.

If the program determines in decision diamond 17 that the measured value, for example R1 or R2, of a tested component does not fall within the predetermined tolerances, the program branches to a processing box 19 where a diagnostic routine is initiated. The program also proceeds to a processing box 20 where the data is stored for statistical purposes. Finally, the program proceeds to a processing box 21 where the main program starts an emergency program. This emergency program may consist, for example, in deactivating the automatic system of the transmission, in enabling one to drive only in the manual-shift mode, or in a shifting to a specified gear.

In the specific embodiment of the invention described in FIG. 1, the operation of the control system essentially consists of four parts. These parts are as follows: an operating-state check represented by program elements 1 through 7; a self-test represented by the program components 8 through 11; the actual checking of the electrical components of the motive unit represented by program components 13 through 18; and the measures taken on the basis of the test result and represented by the programming components signified by the numerals 12, 19, 20 and 21.

A particular embodiment of a control system embodying the invention will now be described with reference to the electrical block diagram depicted in FIG. 2. This control system is particularly suited to the testing of a complete motive unit, including its engine and mechanical transmission, by taking measurements of their electrical and electronic components. These components can include gear shift transducer magnets, switches, tachometers, and temperature and pressure sensors. The components can be tested in both the dynamic state and in the static state.

The electronic control system includes a peripheral unit 32 that comprises an input/output module, hereinafter referred to as I/O module 34 and a programmable timer module, hereinafter called PTM module 36. Peripheral unit 32 is an interface between the protective part of the control system and a microcomputer 44. I/O module 34 is coupled to a gear shift switch 38, which is part of a transmission 40, and to an engine 42, and provides the data obtained from those units to microcomputer 44. For example, specified positions of the engine gas pedal can provide some of the data. Moreover, a plurality of electromagnets 48 can be operated by microcomputer 44 through I/O module 34. In the present case electromagnets 48 can be gear shift transducer magnets of valves used for shifting the individual gears of transmission 40. For example, signals from microcomputer 44 are transmitted through I/O module 34 and a plurality of power drivers or buffers 46 and coupled by operating leads or connectors 59 to electromagnets 48. Furthermore, signals from electromagnets 48 are transmitted by connectors 59 directly to I/O module 34. Gear shift transducer magnets 48 are examples of components that are tested by the system of the present invention. Drivers 46 are power buffers that are necessary because electromagnets 48 consume a higher current than can be supplied by I/O module 34. I/O module 34 and PTM module 36 of unit 32 are connected together with input and output leads or connectors, not depicted in FIG. 2.

Operating leads or connectors 59 also connect other electrical components to microcomputer 44 through I/O module 34. The components can be rotational speed transducers or sensors, or temperature-sensitive or pressure-sensitive switches indicated at 68. An alphanumeric display unit 53 is also connected to unit 32 and displays important process data and information.

A plurality of connectors, 55/1 through 55/6 are also connected to electromagnets 48, transducers 64 and switches 68 in parallel with connectors 59, and connect these components to a switching network 54. Switching network 54 contains a plurality of switches, which are preferably analog switches that are individually connected to test leads 55/1 to 55/6. These switches (not shown) connect electromagnets 48, speed transducers 64, and switches 68 to an analog-to-digital converter, hereinafter referred to as A/D converter 56, for monitoring and testing during a test routine. A/D converter 56 receives the analog measured values of the corresponding monitored components from switching network 54 and converts the analog values into digital signals. The outputs of A/D converter 56 are connected to peripheral unit 32 with a plurality of connectors shown bundled together at 57. Unit 32 is in data communication with microcomputer 44 through bidirectional data and address lines 58. The analog switches of switching network 54 are selectively triggered by microcomputer 44 through unit 32 and circuits 61, only one of which is symbolically shown. Thus, the analog switches of switching network 54 can be connected selectively in order to test one or more of the motive unit components at a time such components being represented by electromagnets 48, speed transducers 64, and switches 68.

A priority control circuit 60 is also in data communication with microcomputer 44. Priority control circuit 60 is connected through data and address lines 62 and has as its task to interrupt the current program of microcomputer 44, immediately or with a delay, depending upon the assigned priority of the components. The "current or active program" can be the operating program for the control of the motive unit or can be an emergency program. The component connected to priority control circuits 60 can be running in the dynamic or in the static operating condition. Priority control circuit 60 is a commercially available circuit and is well known in computer technology. If several interrupt requests occur at the same time, priority control circuit 60 selects only one of the interrupt requests for delivery to microcomputer 44 based on a predetermined order of priority. If an interrupt request has already been transmitted to microcomputer 44 and, subsequently, a higher priority interrupt request is transmitted to priority control circuit 60, the previous process in microcomputer 44 which has been activated by the lower priority interrupt (e.g. an initiated emergency program) is itself interrupted and the higher priority request is carried out by microcomputer 44.

A program interrupt request with specified priority can be the following:

I1 = operating voltage outside of predetermined tolerances

I2 = regulated voltage outside of predetermined tolerances

I3 = inactive state or breakdown of a speed transducer 64 monitoring the engine speed, (or engine speed = 0)

I4 = inactive state or breakdown of a second speed transducer 64 monitoring the transmission speed (transmission speed = 0);

I5 = signals concerning faults in the program flow of the microcomputer

I7 = signals concerning faults in other speed transducers 68 for monitoring, for example, the oil pressure, temperature, and mechanical faults of transmission 40 or of components cooperating therewith.

All of the signals of electromagnets 48, speed transducers 64 and switches 68 being monitored are transmitted to switching network 54. Other signals, such as signals I3 and I4 of speed transducers 64 are transmitted through retriggerable monostable multivibrator circuits 70 or 72 to priority control circuit 60. Multivibrators circuits 70 and 72 serve to determine whether or not transmission 40 and engine 42 are stopped or whether their parts are rotating. Speed transducers 64 provide a plurality of pulses which continually trigger multivibrator circuit 70 and 72. Multivibrator circuits 70 and 72 have a switching time or pulse length that is longer than the pulses generated by speed transducer 64. Said another way, multivibrator circuit 70 and 72 lengthen the pulses of speed transducers 64 so long as the components which they monitor are rotating.

Speed transducers 64 also transmit signals corresponding to their speeds through operating lines or connectors 59 and through I/O and PTM unit 32 to microcomputer 44. Microcomputer 44 is capable when in the operating program mode of shifting transmission 40 to a predetermined or specified gear with electromagnets 48 depending upon the speed measured by speed transducer 64. At the same time, speed transducer 64 transmits signals corresponding to the measured speed to microcomputer 44 through a frequency/voltage converter, hereinafter referred to as F/V converter 74 or 76. From F/V converter, the signals are sent to corresponding Schmitt trigger circuits 78 and 80 and through peripheral unit 32. Schmitt triggers 80 and 78 each transmit a signal T1 or T2 to microcomputer 41 through unit 32 only when a predetermined maximum value or predetermined minimum value is reached. Signals T1 and T2 each correspond to a predetermined nominal state of a specified gear shift. Microcomputer 44 compares this nominal state with the actual shifted state of transmission 40. Thus, the gear shifts are monitored in the dynamic state by the output signals T1 and T2 generated by Schmitt triggers 78 and 80, respectively. For each gear of transmission 40, there is a gear shift magnet 48 and a corresponding F/V converter 74 or 76 and Schmitt trigger 78 or 80. If the nominal value differs from the actual value, microcomputer 44 is programmed to first interrogate other criteria before taking other action. For example, microcomputer 44 is programmed to determine whether the vehicle and the transmission have been stopped, or whether there is an emergency signal from the engine. If this is not the case, that is if the difference between the nominal and actual values is not caused by external factors originating outside of the mode of unit, the microcomputer is programmed to initiate an emergency program. The emergency program may comprise, for example, instructions to deactivate the automatic gear selection of transmission 40 and to permit transmission 40, for example, to be driven only in second gear.

During the operation as described above, microcomputer 44 compares the states of the outputs of Schmitt triggers 78 and 80 (which as mentioned above are connected thereto through PTM module 36) taking into account the particular position of gear-selection switch 38 with the electric signals of drivers 46. If the measured value of PTM module 36 plus or minus a permitted preprogrammed tolerance, does not correspond to the initial state of Schmitt triggers 78 and 80, the current supply can be interrupted by an operating voltage source 92 to gear shift magnets 48 by means of a safety circuit 96. Safety circuit 96 may correspond to an emergency program. Alternatively, the current supply can be maintained and a corresponding, different emergency program can be initiated. Safety circuit 96 is triggered by I/O module 34. The particular type of emergency program that is initiated depends upon the mechanical construction and other conditions of the particular automatic transmission 40. A feedback signal is transmitted from the output of drivers 46 through connectors 59 to I/O module 34. This feature permits the detection of inadmissible operating conditions of the gear shift electromagnets 48, and, depending thereupon, the current supply to the appropriate electromagnet 48 can be cut off.

A circuit 82 monitors the operating voltage 92 through a connector 94. Circuit 82 is comprised of a voltage divider 81, a Schmitt trigger circuit 83, and a connector or line 84 connected to priority control circuit 60. Circuit 82 provides a priority signal to indicate whether the operating voltage is within predetermined tolerances. If the operating voltage is not within tolerances, this condition is reported by priority control circuit 60 to microcomputer 44 with the highest priority, whereupon microcomputer 44 is programmed to immediately initiate an emergency program.

A voltage regulator circuit 86, also connected by connector 94 to operating voltage source 92, provides a stablized or regulated voltage "Ustab." Regulator circuit 86 is connected to priority control circuit 60 through a voltage divider circuit, a Schmitt trigger 88 and a connector 90 to provide an indication whether the regulated voltage is within acceptable tolerances. If the regulated voltage is not within these tolerances, this is reported to microcomputer 44 by the second highest interrupt priority I2 and the microcomputer 44 is programmed to initiate an emergency program.

Figure 2:
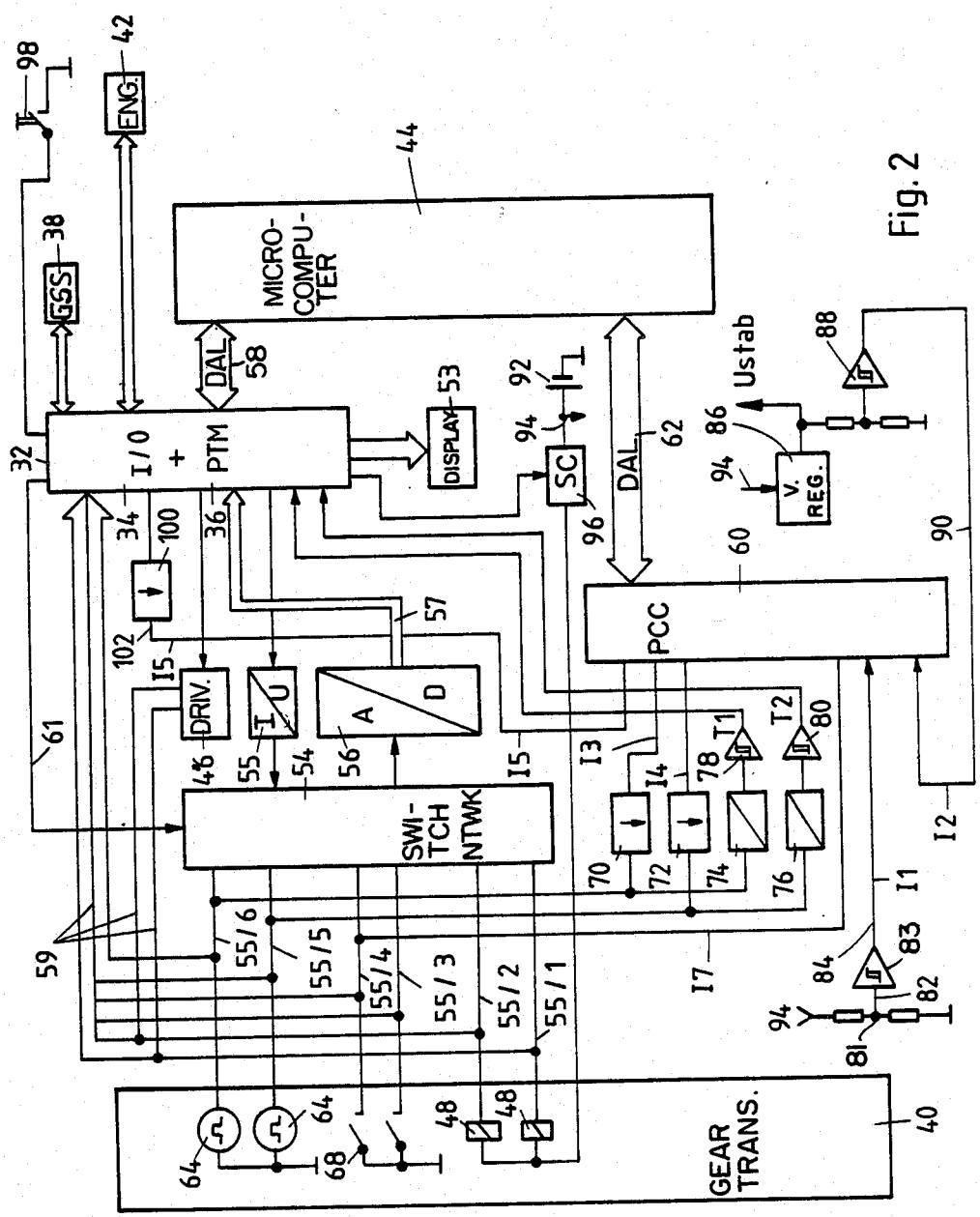
FIG. 2 is an electrical schematic block diagram of the electronic control system according to one embodiment for carrying out the method depicted in FIG. 1.

The part of the control system in FIG. 2 acting as a protective unit can be selectively switched on and off by a switch 98. Switch 98 connects power from operating voltage source 92 to unit 32. When switch 98 is turned on, the system works continuously in accordance with the program flow chart depicted in FIG. 1.

A further retriggerable monostable multivibrator circuit 100 (which may also be a flip-flop circuit) is continually triggered by microcomputer 44 by means of trigger signals transmitted through I/O module 34 at regular time intervals such that a specified signal from output 102 of circuit 100 is transmitted without interruption to priority control circuit 60 so long as the normal operating program is running. The trigger signals are generated by the normal operating program of microcomputer 44. If a malfunction occurs in the execution of the normal operating program, the trigger signals normally provided thereby cease to be provided and a program fault report interrupt I5 is transmitted to priority control circuit 60. Circuit 60 then transmits an interrupt request signal to microcomputer 44. In this way, the current operating program is interrupted by microcomputer 44 and the latter is placed in a predetermined initialized state. This initialized state may be the start address of an emergency program. Moreover, safety circuit 96 is also triggered by microcomputer 44 through unit 32.

Figure 3:
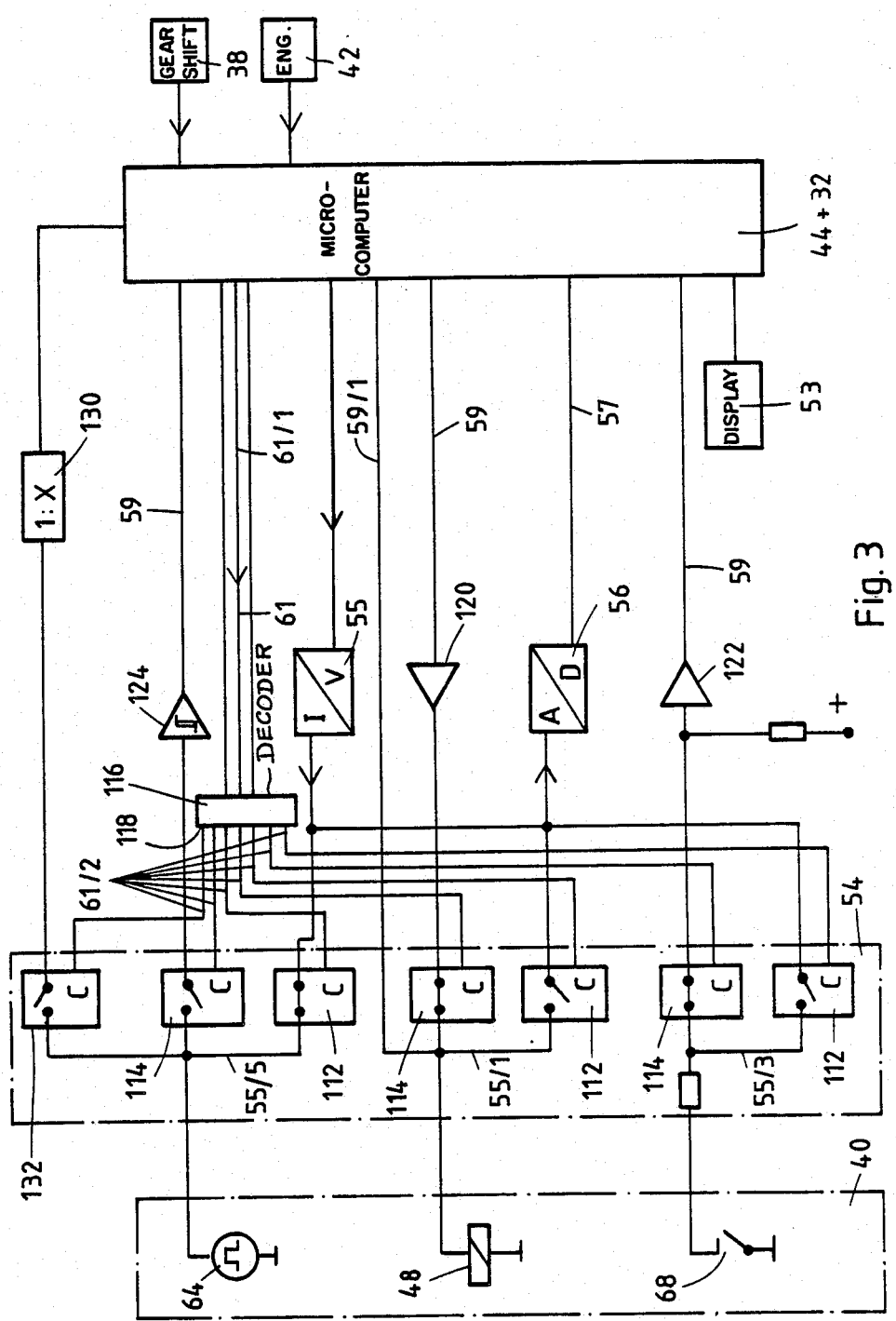
FIG. 3 is an electrical schematic block diagram of a modified embodiment of a control system according to the present invention.

FIG. 3 depicts another specific embodiment of a protective gear embodying the present invention for monitoring the components of a motive unit both in the dynamic or running condition and in the static or stopped condition. In FIG. 3, parts having the same function as in FIG. 2 are designated by the same reference numerals.

FIG. 3 depicts a component in the form of a rotational-speed transducer or sensor 64 which generates a signal corresponding to the speed of transmission unit 40 or of engine 42. A test lead or connector 55/5 is connected to the output of transducer 64. A gear shift electromagnetic 48 is used for shifting the gears of transmission 40 and is also a component which is monitored and which provides signals on its corresponding test lead or connector 55/1 corresponding to the particular operating state concerned.

A switch 68 is also a component that is tested and which can be a pressure switch or temperature switch. Switch 68 provides at its output a signal corresponding to the particular operating or functional state of the sensor to a test lead or connector 55/3.

Connectors 55/1, 55/3 and 55/5 are each connected to two switches 112 and 114 of a switching network 54. Preferably, as in the embodiment of FIG. 2, these switches are analog switches that have no direct connection between their input and output even if the switch is "closed." Rather, these switches generate at their output an output signal that corresponds to the magnitude of the input signal. The outputs of switches 112 are connected to the analog input of an analog-to-digital converter 56 and to the output of a current/voltage source 55. Switches 112 are triggered by microcomputer 44 through lines 61 and are opened or closed as a result. In the embodiment of FIG. 3, it is assumed that unit 32 with subunits 34 and 36 depicted in FIG. 2 is integrated into microcomputer 44. Switches 112 of switching network 54 are also included in FIG. 2, but are not shown therein.

In FIG. 3, switches 114 are located in operating lines 59 and are closed when switches 112 are open. Conversely, switches 114 are open when switches 112 are closed. All switches 112 and 114 are controlled by microcomputer 44 through lines 61. A decoder 116 is interposed between microcomputer 44 and switches 112 and 114. Decoder 116 divides lines 61 into an input line sections 61/1 and an output line sections 61/2. Decoder 116 results in there being fewer line sections 61/1 than line sections 61/2 and switches 112 and 114. From the output side 118 of the decoder 116, there are a plurality of separate line sections 61/2 that are equal in number and are connected to switches 112 and 114.

Drivers or amplifiers 120 and 122 are provided in operating lines 59 of gear shift magnet 48 and of switch 68, between microcomputer 44 and switching network 54, and deliver a signal to electromagnet 48 and from switch 68, respectively. A Schmitt trigger 124 is provided in operating line 59 of speed transducer 64 between switch 114 of switching network 54 and microcomputer 44. Schmitt trigger 124 generates rectangular pulses for microcomputer 44 from the substantially sinusoidal pulses provided by speed transducer 64.

The line branches with switches 112 permit the testing of components 48, 64 and 68 in the static or rest state, that is when transmission 40 is stopped and, when the occasion arises, also when engine 42 is stopped. Lines 59 with the other switches 114 of network 54 have the purpose of testing components 48, 64 and 68 when the components are in the dynamic state, i.e. when the parts of transmission 40 are rotating. These components can also serve to determine whether other parts of transmission 40 are rotating. The use of switches 114 in operating lines 59 offers the advantage that these lines 59 and the corresponding part of microcomputer 44 can be taken out of the test branches containing switches 112 and, as a result, avoid the distortion of the measured electrical resistance when testing in the static state or stopped condition.

The system can also test itself by means of a self-test while in the static state. While the motive unit is in the stopped condition, microcomputer 44 transmits and receives a test signal through an operating lead 59 with its corresponding buffer 120, a closed switch 114 corresponding to the particular gear shift electromagnet 48, and a return lead 59/1. In the process, switch 112 of this gear shift magnet 48 is kept open.

For a further self-test of the system in the stopped condition or static state, a low-frequency test signal is generated by dividing the output of a crystal clock of microcomputer 44 in a voltage divider 130. This test signal returns to microcomputer 44 through a switch 132 which is closed in the static state for this self-test and through another closed switch 114 (e.g. of components 64) via its operating lead 59. The microcomputer detects equipment failure on the basis of variations in the value of the returning signal.

The present invention has been described with respect to specific embodiments thereof. Other features, advantages, changes and modifications would be apparent to those skilled in the art.

We claim:

1. An electronic control system for a motive unit such as a vehicle having rotational components and sensing electrical components, said electrical components including at least one pulse generator for detecting rotation of a respective at least one of said rotating components, said electronic control system comprising:

means for supplying an operative voltage;

a microcomputer; and a protective unit connected between components of the motive unit and the microcomputer, said protective unit comprising (a) a first means, which includes said at least one pulse generator and which is actuated upon the supplying of said operating voltage, for detecting when the rotating components are stopped and for providing information indicating a stop to said microcomputer, (b) a second means for obtaining information from the electrical components about their normal and proper function or malfunction during the time the rotating components are stopped and for providing said information to said microcomputer, whereupon said microcomputer in response to said information executes either an emergency program for the emergency control of the motive unit or an operating program for the normal control of the motive unit;

(c) a third means for obtaining information from the electrical components about their normal and proper function or malfunction during the time the electrical components are sensing and the rotating components are rotating and said microcomputer is under control of an operating program, said third means also for causing an interrupt to be sent to the microcomputer which interrupts said operating program when a malfunction of at least one of the electrical components occurs and initiates an emergency program;

(d) a fourth means which together with said microcomputer is supplied with said operating voltage upon the detection of the rotating components being stopped whereby said fourth means is first activated by said microcomputer for performing a system self-test for determining the presence of malfunctions within said protective unit before said microcomputer submits a query requesting specific data from the electrical components indicating their proper function or malfunction;

(e) a priority control circuit connected between the electrical components and said microcomputer and which causes interrupts in the currently running program of said microcomputer, said interrupts having a priority and including interrupts caused by signal values of the electrical components differing from a predetermined range, and an interrupt caused by a program execution fault in the program currently running on the microcomputer, said interrupts interrupting the microcomputer immediately or with a delay depending upon the interrupt priority; and (f) a first branch circuit that includes a programmable timer module connected to every said at least one pulse generator and which detects pulses from each at least one pulse generator that corresponds to digital speed; and a second branch circuit having an output signal indicative of speed that includes a respective frequency/voltage converter whose input is connected to every said at least one pulse generator for receiving speed signals from each said at least one pulse generator, a respective Schmitt trigger connected at the respective input thereof to every said frequency/voltage converter and a respective input/output unit connected between every output of a said respective Schmitt trigger and said microcomputer; said microcomputer being programmed to compare the signals of said first and second branch circuits and if there are variations therebetween to switch to an emergency program.

2. An electronic control system as claimed in claim 1 and further comprising a current/voltage source; and an analog-to-digital converter; and wherein said protective unit comprises a first connecting means for connecting the electrical components to said microcomputer for normal operation and for checking of malfunctions of said electrical components when said rotating parts are rotating, and a second connecting means for connecting the electrical components to said microcomputer for providing specific data thereto when said rotating parts are stationary, said second connecting means comprising at least one switch controlled by said microcomputer, said switch for connecting said current/voltage source to the electrical components, said microcomputer determining in accordance with the type of electrical component to be tested whether said current/voltage source supplies thereto a constant current or a constant voltage; and wherein the analog side of said analog-to-digital converter is connected between said current/voltage source and said switch and the digital side of said converter is connected to said microcomputer so that the value of the digital output from said converter is proportional to the electrical resistance of the electrical component to be checked.

3. An electronic control system as claimed in claim 2 wherein said first connecting means includes at least one switch operatively connected to said switch of said second connecting means such that said switch of said first connecting means is opened and closed alternately wherever said switch of said second connecting means is alternately closed and opened, respectively.

4. An electronic control system as claimed in claim 3 wherein said at least one switch is an analog switch.

5. An electronic control system as claimed in claim 2 wherein said at least one switch is an analog switch.

6. An electronic control system as claimed in claim 1 wherein said motive unit further includes a transmission, and further including an electrical safety circuit controlled by said microcomputer and which interrupts the power supplied to the electrical components, the electrical components being transmission control means, and the microcomputer causing said power interruption upon the detection of improper conditions in said transmission.

7. An electronic control system as claimed in claim 1 wherein said at least one pulse generator is connected to said priority control circuit through a retriggerable monostable trigger circuit.

8. An electronic control system as claimed in claim 7 wherein said microcomputer is also connected to said priority control circuit through a retriggerable monostable trigger circuit.

9. An electronic control system as claimed in claim 1 wherein said microcomputer is also connected to said priority control circuit through a retriggerable monostable trigger circuit.

* * * * *